(12) United States Patent
Ihn et al.

(10) Patent No.: US 9,660,207 B2
(45) Date of Patent: May 23, 2017

(54) ORGANIC SOLAR CELL

(71) Applicant: Samsung Electronics Co., Ltd., Suwon-Si, Gyeonggi-Do (KR)

(72) Inventors: Soo Ghang Ihn, Hwaseong-si (KR); Jong Hwan Park, Yongin-si (KR); Yeon Ji Chung, Seoul (KR); Young Min Nam, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 700 days.

(21) Appl. No.: 13/948,534

(22) Filed: Jul. 23, 2013

(65) Prior Publication Data

US 2014/0026948 A1    Jan. 30, 2014

(30) Foreign Application Priority Data

Jul. 25, 2012 (KR) .................. 10-2012-0081257
Jun. 18, 2013 (KR) .................. 10-2013-0069889

(51) Int. Cl.
*H01L 51/42* (2006.01)
*H01L 27/30* (2006.01)
(Continued)

(52) U.S. Cl.
CPC .......... *H01L 51/4246* (2013.01); *B82Y 10/00* (2013.01); *C08G 61/126* (2013.01); *H01L 27/302* (2013.01); *B82Y 30/00* (2013.01); *B82Y 99/00* (2013.01); *C08G 2261/124* (2013.01); *C08G 2261/146* (2013.01); *C08G 2261/1424* (2013.01); *C08G 2261/1426* (2013.01); *C08G 2261/1428* (2013.01); *C08G 2261/3243* (2013.01); *C08G 2261/91* (2013.01);
(Continued)

(58) Field of Classification Search
CPC ............. H01L 51/4246; H01L 51/0036; H01L 51/0037; H01L 51/0043; H01L 51/0057; H01L 51/4253
See application file for complete search history.

(56) References Cited

U.S. PATENT DOCUMENTS 5,698,048 A * 12/1997 Friend .................. B82Y 10/00
  136/252
8,324,616 B2   12/2012 Xavier et al.
(Continued)

FOREIGN PATENT DOCUMENTS

KR    20100044865 A    4/2010
KR    20100092592 A    8/2010
(Continued)

OTHER PUBLICATIONS

Sriniva Sista et al., Highly Efficient Tandem Polymer Photovoltaic Cells, Advanced Materials 2010, vol. 22, pp. 380-383.
(Continued)

*Primary Examiner* — Golam Mowla
(74) *Attorney, Agent, or Firm* — Harness, Dickey & Pierce, P.L.C.

(57) ABSTRACT

An organic solar cell includes a first sub-cell including a first active layer and a second sub-cell including a second active layer, wherein at least one of the first active layer and the second active layer includes at least two types of electron acceptors having different light absorbance from each other.

17 Claims, 9 Drawing Sheets

(51) Int. Cl.
  *C08G 61/12*   (2006.01)
  *B82Y 10/00*   (2011.01)
  *B82Y 99/00*   (2011.01)
  *H01L 51/00*   (2006.01)
  *C08K 3/04*   (2006.01)
  *C09D 165/00*   (2006.01)
  *B82Y 30/00*   (2011.01)

(52) U.S. Cl.
  CPC .............. *C08K 3/04* (2013.01); *C09D 165/00* (2013.01); *H01L 51/0036* (2013.01); *H01L 51/0037* (2013.01); *H01L 51/0043* (2013.01); *H01L 51/0047* (2013.01); *H01L 51/4253* (2013.01); *H01L 2251/308* (2013.01); *Y10S 977/735* (2013.01); *Y10S 977/948* (2013.01)

(56)  References Cited

U.S. PATENT DOCUMENTS

| | | | |
|---|---|---|---|
| 2010/0224252 A1* | 9/2010 | Scharber | C08G 61/123 136/263 |
| 2010/0282309 A1 | 11/2010 | Pschirer et al. | |
| 2011/0012091 A1 | 1/2011 | Forrest et al. | |
| 2011/0174367 A1 | 7/2011 | Hayashi et al. | |
| 2011/0253206 A1 | 10/2011 | Maeda et al. | |
| 2011/0297216 A1 | 12/2011 | Ihn et al. | |
| 2011/0297234 A1 | 12/2011 | Forrest et al. | |
| 2011/0315225 A1 | 12/2011 | Choi et al. | |
| 2012/0125419 A1 | 5/2012 | Pfeiffer et al. | |
| 2012/0279568 A1 | 11/2012 | Choi et al. | |
| 2012/0298193 A1 | 11/2012 | Ihn et al. | |
| 2013/0112613 A1 | 5/2013 | Kang et al. | |
| 2013/0263919 A1 | 10/2013 | Lim et al. | |

FOREIGN PATENT DOCUMENTS

| | | |
|---|---|---|
| KR | 20100099504 A | 9/2010 |
| KR | 10-2011-0023164 | 3/2011 |
| KR | 20110036185 A | 4/2011 |
| KR | 20110079886 A | 7/2011 |
| KR | 20110119710 A | 11/2011 |
| KR | 20110133717 A | 12/2011 |
| KR | 10-2012-0000522 | 1/2012 |
| KR | 101104226 B1 | 1/2012 |
| KR | 20120000409 A | 1/2012 |
| KR | 20120000522 A | 1/2012 |
| KR | 101170919 B1 | 8/2012 |
| KR | 20120124695 A | 11/2012 |
| KR | 20120130706 A | 12/2012 |
| KR | 20130049616 A | 5/2013 |
| KR | 10-2013-0113229 | 10/2013 |

OTHER PUBLICATIONS

Cheng-Hsuan Chou et al., A Metal-Oxide Interconnection Layer for Polymer Tandem Solar Cells With and Inverted Architecture, Advanced Materials, 2011, vol. 23, pp. 1282-1286.

Letian Dou et al., Tandem Polymer Solar Cells Featuring a Spectrally Matched Low-Bandgap Polymer, Nature Photonics Articles, pp. 1-6, 2012.

Afshin Hadipour et al., Solution-Processed Organic Tandem Solar Cells, Advanced Functional Materials, 2006, vol. 16, pp. 1897-1903.

Jan Meiss et al., Highly Efficient Semitransparent Tandem Organic Solar Cells With Complementary Absorber Materials, Applied Physics Letters, 99, 043301, 2011.

Srinivas Sista et al, Tandem Polymer Photovoltaic Cells—Current Status, Challenges and Future Outlook, Energy and Environmental Science, 2011, 4, 1606-1620.

Yongye Liang et al, Development of New Semiconducting Polymers for High Performance Solar Cells, 2009, American Chemical Society, 131, 56-57.

Kuwat Triyana et al, Improvement of Heterojunction Donor/Acceptor Organic Photovoltaic Devices by Emplying Additional Active Layer, Japanese Journal of Applied Physics, vol. 44, No. 4A, 2005, pp. 1974-1977.

Ben Minneart et al., Efficiency Potential of Organic Bulk Heterojunction Solar Cells, Progress in Photovoltaics: Research and Applications, 2007, 15, 741-748.

* cited by examiner

ORGANIC SOLAR CELL

CROSS REFERENCE TO RELATED APPLICATIONS

This application claims priority to and the benefit of Korean Patent Application No. 10-2012-0081257 and 10-2013-0069889 filed in the Korean Intellectual Property Office on July 25, 2012 and Jun. 18, 2013, respectively, the entire contents of which are incorporated herein by reference.

BACKGROUND

1. Field

Example embodiments provide an organic solar cell.

2. Description of the Related Art

An organic solar cell is a photoelectric conversion device that transforms solar energy into electrical energy, and has attracted attention as an infinite but pollution-free next generation energy source.

An organic solar cell includes a photoactive layer including p-type and n-type organic semiconductors, and produces electrical energy by transferring electrons and holes to the n-type and p-type semiconductors, respectively, and then collecting the electrons and holes in each electrode when an electron-hole pair (EHP) is produced by solar light energy absorbed in a photoactive layer inside the semiconductors.

However, an organic semiconductor absorbs only light of a predetermined or given wavelength region due to inherent characteristics of the material, and therefore light of relatively wide wavelength regions are unfavorably not absorbed.

In order to solve the above limitation, a tandem organic solar cell including a plurality of sub-solar cells (hereinafter referred to as "sub-cells") absorbing light of different wavelength regions is suggested.

A tandem organic solar cell is capable of absorbing light of relatively wide wavelength regions and thus increases light absorbance.

However, an entire output current of a tandem organic solar cell is determined by a sub-cell having the lowest output current of a plurality of sub-cells, and thus excessive charges of sub-cells having a higher output current do not contribute to output and performance of a tandem organic solar cell may be deteriorated.

SUMMARY

Example embodiments provide a tandem organic solar cell that may prevent or reduce performance degradation by excessive charges.

According to example embodiments, an organic solar cell includes a first sub-cell including a first active layer and a second sub-cell including a second active layer, wherein at least one of the first active layer and the second active layer includes at least two types of electron acceptors having different light absorbance from each other.

The first active layer may include a first electron donor absorbing light of a first wavelength region and a first electron acceptor, and the second active layer may include a second electron donor absorbing light of a second wavelength region longer than the first wavelength region and a second electron acceptor and a third electron acceptor having different light absorbance from each other.

The second electron acceptor and the third electron acceptor may absorb light having equivalent wavelength regions to each other.

The second electron acceptor and the third electron acceptor may absorb light of different wavelength regions from the second electron donor.

The second electron acceptor and the third electron acceptor may be included in a weight ratio of about 1:99 to about 99:1.

The second electron acceptor may include a compound having a light absorbing moiety of an optically symmetric structure, and the third electron acceptor may include a compound having a light absorbing moiety of an optically asymmetric structure.

The second electron acceptor may include a fullerene derivative having a fullerene core of an optically symmetric structure, and the third electron acceptor may include a fullerene derivative having a fullerene core of an optically asymmetric structure.

The fullerene derivative of the second electron acceptor and the third electron acceptor may have a common functional group.

The second electron acceptor may include one of $C_{60}$, PC60BM, IC60BA, and a combination thereof, and the third electron acceptor may include one of $C_{70}$, PC70BM, IC70BA, and a combination thereof.

The first electron donor may include a first compound having a bandgap of about 1.6 to about 2.2 eV, and the second electron donor may include a second compound having a bandgap of about 0.6 to about 2.0 eV.

The first wavelength region may be about 200 nm to about 780 nm, and the second wavelength region may be about 400 nm to about 2000 nm.

The first sub-cell and the second sub-cell may be coupled in series.

According to example embodiments, an organic solar cell includes a first electrode, a first active layer on one side of the first electrode, an interconnection part on one side of the first active layer, a second active layer on one side of the interconnection part and including at least two types of electron acceptors having different light absorbance from each other, and a second electrode on the second active layer, wherein the first electrode, the first active layer, and the interconnection part generate a first output current, and the second electrode, the second active layer, and the interconnection part generate equivalent second output currents to the first output current by controlling a composition ratio of the at least two types of electron acceptors having different light absorbance from each other.

The first active layer may include a first electron donor absorbing light of a first wavelength region and a first electron acceptor, and the second active layer may include a second electron donor absorbing light of a second wavelength region longer than the first wavelength region and a second electron acceptor and a third electron acceptor having different light absorbance from each other.

The first wavelength region may be about 200 nm to about 780 nm, and the second wavelength region may be about 400 nm to about 2000 nm.

The second electron acceptor and the third electron acceptor may be included in a weight ratio of about 1:99 to about 99:1.

The second electron acceptor and the third electron acceptor may absorb light having equivalent wavelength regions to each other, and the second electron acceptor and the third electron acceptor may absorb light of different wavelength regions from the second electron donor.

The second electron acceptor may include a fullerene derivative having a fullerene core of an optically symmetric structure, and the third electron acceptor may include a fullerene derivative having a fullerene core of an optically asymmetric structure.

The fullerene derivative of the second electron acceptor and the third electron acceptor may have a common functional group.

The interconnection part may include at least one multilayer including at least one of a conductive polymer, an insulating polymer, a ferroelectric polymer, and a metal oxide.

The at least one multilayer may be a plurality of multilayers, and the interconnection part may include a conductive thin film between the plurality of multilayers.

The second output current may be about 0.9 to about 1.1 times the first output current.

DETAILED DESCRIPTION

Figure 1:
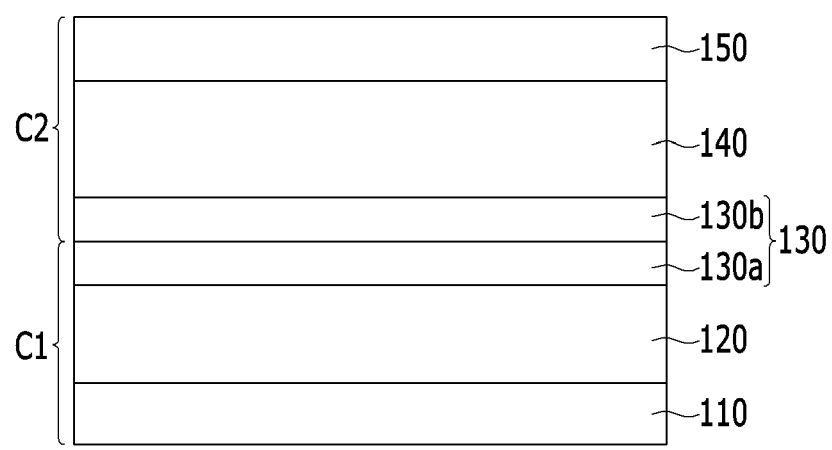
FIG. 1 is a cross-sectional view illustrating an organic solar cell according to example embodiments.

Hereinafter, example embodiments will be described in detail so that a person skilled in the art would understand them. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present.

In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

Hereinafter, an organic solar cell according to example embodiments is described referring to drawings. FIG. 1 is a cross-sectional view illustrating an organic solar cell according to example embodiments.

Referring to FIG. 1, an organic solar cell according to example embodiments includes a first sub-cell C1 and a second sub-cell C2 that are sequentially stacked, and the first sub-cell C1 and the second sub-cell C2 are connected to each other through an interconnection part 130.

The first sub-cell C1 includes a first electrode 110, a first active layer 120, and a first interconnection part 130a, and the second sub-cell C2 includes a second interconnection part 130b, a second active layer 140, and a second electrode 150.

A substrate (not shown) may be positioned on the side of the first electrode 110 or the second electrode 150, and may be made of, for example, a light transmittance material.

The light transmittance material may include, for example, an inorganic material (e.g., glass) or an organic material (e.g., polycarbonate, polymethyl methacrylate, polyethylene terephthalate, polyethylene naphthalate, polyamide, polyether sulfone, or a combination thereof).

One of the first electrode 110 and the second electrode 150 may be an anode and the other may be a cathode.

When the first electrode 110 is an anode, the first interconnection part 130a may function as a cathode, and when the first electrode 110 is a cathode, the first interconnection part 130a may function as an anode.

Likewise, when the second electrode 150 is an anode, the second interconnection part 130b may function as a cathode, and when the second electrode 150 is a cathode, the second interconnection part 130b may function as an anode.

One of the first electrode 110 and the second electrode 150 may be made of, for example, a transparent conductor selected from conductive oxide (e.g., indium tin oxide (ITO), indium doped zinc oxide (IZO), tin oxide (SnO$_2$), aluminum doped zinc oxide (AZO), and gallium doped zinc oxide (GZO), conductive carbon composites (e.g., carbon nanotubes (CNT) or graphene), and the other may be made of an opaque conductor (e.g., aluminum (Al), silver (Ag), gold (Au), and/or lithium (Li)). Alternatively, both the first electrode 110 and the second electrode 150 may be made of, for example, a transparent conductor.

The interconnection part 130 includes the first interconnection part 130a of the first sub-cell C1 and the second interconnection part 130b of the second sub-cell C2, and an interface between the first interconnection part 130a and the second interconnection part 130b may be a recombination center of charges of the first interconnection part 130a and charges of the second interconnection part 130b.

The first interconnection part 130a and the second interconnection part 130b may include, for example, a conductive polymer, an insulating polymer, a ferroelectric polymer, a metal oxide, or a combination thereof, and may be a monolayer or include multiple layers.

The conductive polymer may include, for example, PEDOT:PSS, and the metal oxide may be, for example, an oxide of nickel (Ni), ruthenium (Ru), tungsten (W), molybdenum (Mo), vanadium (V), iridium (Ir), titanium (Ti), zinc (Zn), or oxides of the foregoing metals, but is not limited thereto.

The interconnection part 130 may further include a conductive thin film (not shown) between a plurality of layered interconnection parts 130a and 130b.

The conductive thin film may function as an effective recombination center of charges.

The conductive thin film may be, for example, a light transmittance conductor that has less effect on light transmission, for example, a conductive oxide layer (e.g., an indium tin oxide layer and/or a relatively thin metal layer).

The first active layer 120 and the second active layer 140 may each include a photoactive material including an electron acceptor made of an n-type semiconductor material and an electron donor made of a p-type semiconductor material.

The electron acceptor and the electron donor may realize, for example, a bulk heterojunction structure.

In the bulk heterojunction structure, electron-hole pairs excited by light absorbed by the first photoactive layer 120 and the second active layer 140 are diffused and reach the interface between the electron acceptor and the electron donor, the electron-hole pairs are separated by a difference of electron affinity between the two materials at the interface, and electrons are transferred to a cathode through an electron acceptor and holes are transferred to an anode by an electron donor to generate a photocurrent.

The first active layer 120 and the second active layer 140 include electron donor absorbing light of different wavelength regions from each other.

The first active layer 120 may include a first electron donor absorbing light of a relatively short wavelength region, for example about 200 nm to about 780 nm.

The first electron donor absorbing light of a relatively short wavelength region may include, for example, a first compound having a bandgap of about 1.6 to about 2.2 eV, and examples of the first compound may include polyaniline; polypyrrole; polythiophene; poly(p-phenylenevinylene); benzodithiophene; thienothiophene; MEH-PPV (poly(2-methoxy-5-(2'-ethyl-hexyloxy)-1,4-phenylene vinylene)); MDMO-PPV (poly(2-methoxy-5-(3,7-dimethyl-octyloxy)-1,4-phenylene-vinylene)); pentacene; perylene; poly(3,4-ethylene dioxythiophene) (PEDOT), poly(3-alkyl-thiophene); polytriphenylamine; phthalocyanine; tin(II) phthalocyanine (SnPc); copper phthalocyanine; triarylamine; benzidine; pyrazoline; styrylamine; hydrazone; carbazole; thiophene; 3,4-ethylene dioxythiophene (EDOT); pyrrole; phenanthrene; tetracene; naphthalene; rubrene; 1,4,5,8-naphthalene-tetracarboxylic dianhydride (NTCDA); and poly(3-hexylthiophene (P3HT), but are not limited thereto.

The first active layer 120 may include a first electron acceptor that realizes a bulk heterojunction structure with the first electron donor.

The first electron acceptor may be a material having a relatively lower LUMO (lowest unoccupied molecular orbital) level than the first electron donor, for example fullerene (e.g., C60, C70, C74, C76, C78, C82, C84, C720, and/or C860), a fullerene derivative (e.g., 1-(3-methoxycarbonyl)propyl-1-phenyl(6,6)C61, C71-PCBM, C84-PCBM, and/or bis-PCBM).

The second active layer 140 may include a second electron donor absorbing light of a relatively long wavelength region, for example, about 400 nm to about 2000 nm.

The second electron donor absorbing light of a relatively long wavelength region may include a second compound having a bandgap of about 0.6 to about 2.0 eV, and examples of the second compound may include poly((4,8-bis(octyloxy)benzo(1,2-b:4,5 -b')dithiophene)-2,6-diyl-alt-(2-((dodecyloxy)carbonyl)thieno(3,4-b)thiophenediyl)-3,6-diyl) (PTB1), poly((4,8-bis(2-ethylhexyloxy)benzo[1,2-b:4,5-b'] dithiophene)-2,6-diyl-alt-(2-((2-ethyl hexyloxy)carbonyl)-3-fluorothieno[3,4-b]thiophenediyl)-3,6-diyl) (PTB7), a cyclopenta[2,1-b:3,4-b']dithiophene-based polymer, a silafluorene-based polymer, a carbazole-based compound, a fluorene-based compound, a halogenated fused thiophene, and a dithieno[3,2-b:2'3'-d]silole-based compound, but are not limited thereto.

The second active layer 140 may include at least two types of electron acceptors that realize a bulk heterojunction structure with the second electron donor.

The electron acceptors may be selected from a material having a relatively lower LUMO level than the second electron donor.

The electron acceptors may be selected from electron acceptors having different light absorbance from each other in a substantially equivalent wavelength region, for example, a second electron acceptor having light absorbance and a third electron acceptor having higher light absorbance in a substantially equivalent wavelength region.

The second electron acceptor and the third electron acceptor may absorb light of a different wavelength region from the second electron donor.

Herein, the light of a different wavelength region may indicate that difference between a maximum absorption wavelength ($\lambda$max) of the second electron acceptor and the third electron acceptor and a maximum absorption wavelength (λmax) of the second electron donor is greater than or equal to about 70 nm.

The light absorbance may be determined by a compound structure.

The second electron acceptor may include a compound having a light absorbing moiety having a low light absorbance structure, and the third electron acceptor may include a compound having a light absorbing moiety having a high light absorbance structure.

For example, the second electron acceptor may include a compound having a light absorbing moiety of an optically symmetric structure, and the third electron acceptor may include a compound having a light absorbing moiety of an optically asymmetric structure.

The light absorbing moiety may be, for example, a fullerene, the second electron acceptor may be, for example, a fullerene derivative having a fullerene core of an optical symmetric structure, and the third electron acceptor may be, for example, a fullerene derivative having a fullerene core of an optically asymmetric structure.

On the other hand, when the second electron acceptor and the third electron acceptor have a side chain, the side chain may have a common functional group.

When the second electron acceptor and the third electron acceptor have a common functional group, the morphology of the second active layer 140 may be improved.

For example, the second electron acceptor may be C60 represented by the following Chemical Formula 1, and the third electron acceptor may be C70 represented by the following Chemical Formula 2.

[Chemical Formula 1]

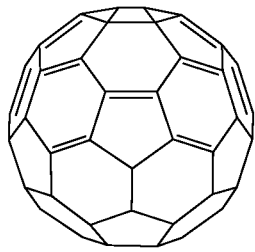

[Chemical Formula 2]

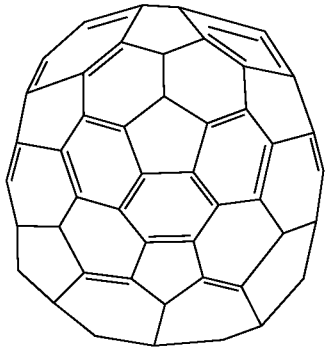

For example, the second electron acceptor may be [6,6]-phenyl-C60-butyric acid methylester ($PC_{60}BM$) represented by the following Chemical Formula 3, and the third electron acceptor may be [6,6]-phenyl-C70-butyric acid methylester ($PC_{70}BM$) represented by the following Chemical Formula 4.

[Chemical Formula 3]

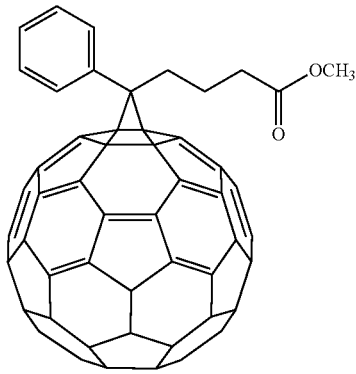

[Chemical Formula 4]

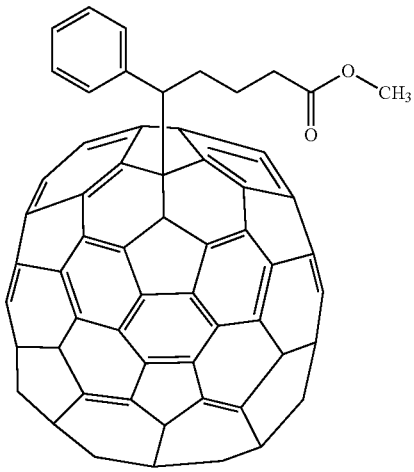

The second electron acceptor may be, for example, indene C60 bis-adduct ($IC_{60}BA$) represented by the following Chemical Formula 5, and the third electron acceptor may be, for example, indene C70 bis-adduct ($IC_{70}BA$) represented by the following Chemical Formula 6.

[Chemical Formula 5]

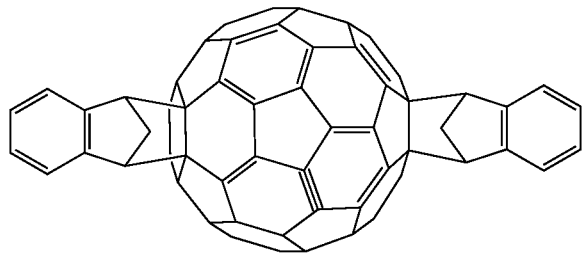

[Chemical Formula 6]

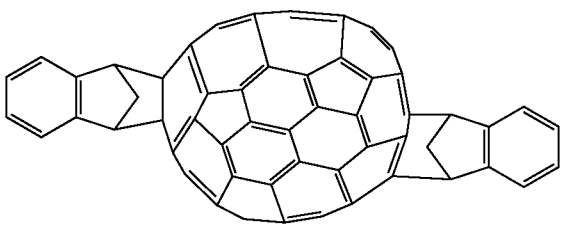

The second electron acceptor and the third electron acceptor may be present in a predetermined or given blending ratio, and the second sub-cell C2 including the second active layer 140 may realize output current by controlling the blending ratio.

The second electron acceptor and the third electron acceptor may be, for example, included in a weight ratio of about 1:99 to about 99:1, and a specific blending ratio may be determined by current matching between the first sub-cell C1 and the second sub-cell C2.

The above will now be specifically described. The organic solar cell according to example embodiments includes a plurality of sub-cells absorbing light of different wavelength regions from each other, and thereby light absorption wavelength regions become wider and light absorbance increases.

For example, as described above, the organic solar cell includes a sub-cell absorbing light of shorter wavelength regions and a sub-cell absorbing light of longer wavelength regions, and thereby both light of shorter wavelengths and light of longer wavelength regions are absorbed and light absorbance increases.

However, a plurality of sub-cells are connected in series, so an entire output current of an organic solar cell may be determined by a sub-cell having a lower output current of a plurality of sub-cells.

Herein, excessive charges of sub-cells having higher output current do not contribute to output and accumulate internally, which may have an effect on performance of an organic solar cell.

Output current of sub-cells may be determined by light absorbance of an active layer, and particularly, in a sub-cell including an electron donor absorbing light of a relatively long wavelength region, light absorbance of an electron acceptor may have a great effect on output current of sub-cells.

In example embodiments, by mixing a plurality of electron acceptors in an active layer of sub-cells having relatively high output current and controlling a blending ratio therebetween, light absorbance may be controlled so that substantially equivalent output current to sub-cells having relatively low output current may be generated.

Herein "controlled so that substantially equivalent output current is generated" indicates that output current of sub-cells having higher output current is controlled to be about 0.9 to about 1.1 times that of sub-cells having lower output current, which may be different as needed.

The organic solar cell according to example embodiments includes a plurality of sub-cells to generate substantially equivalent output currents, and thereby excessive charges caused by output current difference between sub-cells decreases and an unfavorable effect on performance of an organic solar cell caused by accumulation of excessive charges decreases.

On the other hand, through a plurality of sub-cells to generate substantially equivalent output currents, thicknesses of active layers need not be controlled so as to balance output currents between sub-cells.

Therefore, a tool for controlling thicknesses of active layers of each sub-cell is not required, and even a roll-to-roll process in which it is hard to control a thin film thickness may be applicable.

Figure 2:
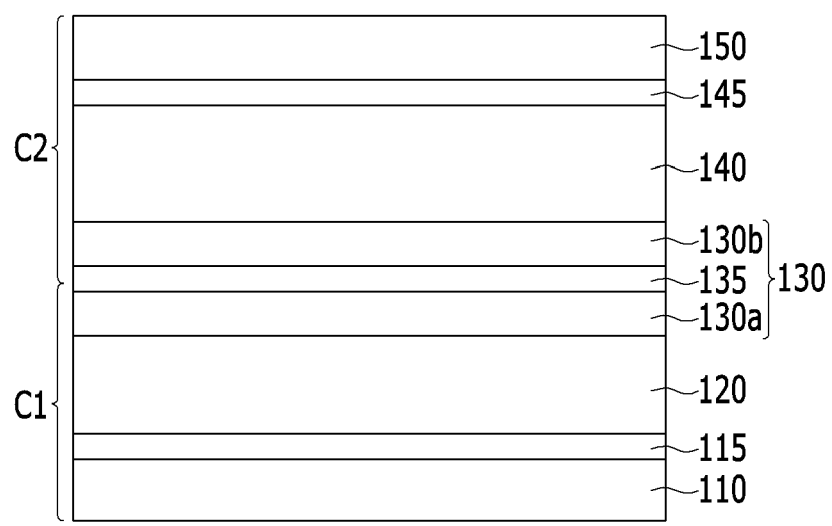
FIG. 2 is a cross-sectional view illustrating an organic solar cell according to example embodiments.

Hereinafter, an organic solar cell according to example embodiments is described referring to FIG. 2. FIG. 2 is a cross-sectional view illustrating an organic solar cell according to example embodiments.

Referring to FIG. 2, the organic solar cell according to example embodiments includes a first sub-cell C1 including a first electrode 110 and a first active layer 120, a second sub-cell C2 including a second active layer 140 and a second electrode 150, and an interconnection part 130.

However, in the organic solar cell according to example embodiments, the interconnection part 130 further includes a third interconnection part 135 between the first interconnection part 130a and the second interconnection part 130b.

The third interconnection part 135 may be interposed between the first interconnection part 130a and the second interconnection part 130b, and may be, for example, a metal thin layer.

In addition, the organic solar cell according to example embodiments further includes an auxiliary layer 115 between the first electrode 110 and the first active layer 120, and an auxiliary layer 145 between the second electrode 150 and the second active layer 140.

The auxiliary layer 115 may help selective charge transport from the first active layer 120 to the first electrode 115, and the auxiliary layer 145 may help selective charge transport from the second active layer 140 to the second electrode 150.

The auxiliary layers 115 and 145 may be at least one selected from, for example, an electron extraction layer (EEL), an electron transport layer (ETL), a hole blocking layer (HBL), a hole extraction layer (HEL), a hole transport layer (HTL), and an electron blocking layer (EBL), but are not limited thereto.

Either or both of the auxiliary layers 115 and 145 may be omitted as needed.

In the above embodiments, for better understanding and ease of description, a solar cell including two sub-cells is illustrated, but the organic solar cell is not limited thereto, and the above embodiments may be applicable to a solar cell including three or more sub-cells.

Hereinafter, the embodiments are illustrated in more detail with reference to examples and comparative examples. However, these are examples, and the present disclosure is not limited thereto.

Manufacture of Organic Solar Cell-1

Example 1

A 180 nm thick ITO anode is formed on a 1 mm-thick transparent glass substrate by a sputtering method.

An active layer is formed on the ITO anode by applying a solution prepared by dissolving an electron donor (Mn=25,000) represented by the following Chemical Formula A and a PC60BM/PC70BM electron acceptor in chlorobenzene:1,8-diiodooctane (97:3, v/v).

Herein, the electron donor represented by Chemical Formula A is mixed with PC60BM and PC70BM in a weight ratio of 10:7.5:7.5 (w/w).

A 100 nm thick aluminum (Al) cathode is formed on the active layer, manufacturing a solar cell.

[Chemical Formula A]

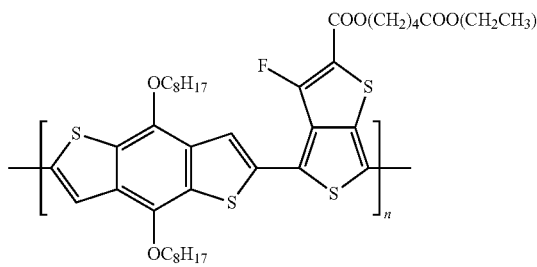

Comparative Example 1

A solar cell is manufactured according to the same method as Example 1, except for using an electron donor represented by Chemical Formula A:$PC_{60}BM$:$PC_{70}BM$ in a weight ratio of 10:15:0 (w/w).

Comparative Example 2

A solar cell is manufactured according to the same method as Example 1, except for using an electron donor represented by Chemical Formula A:$PC_{60}BM$:$PC_{70}BM$ in a weight ratio of 10:0:15 (w/w).

Evaluation 1: Light Absorbance

Then, light absorbance of the solar cells according to Example 1 and Comparative Examples 1 and 2 are evaluated.

Figure 3:
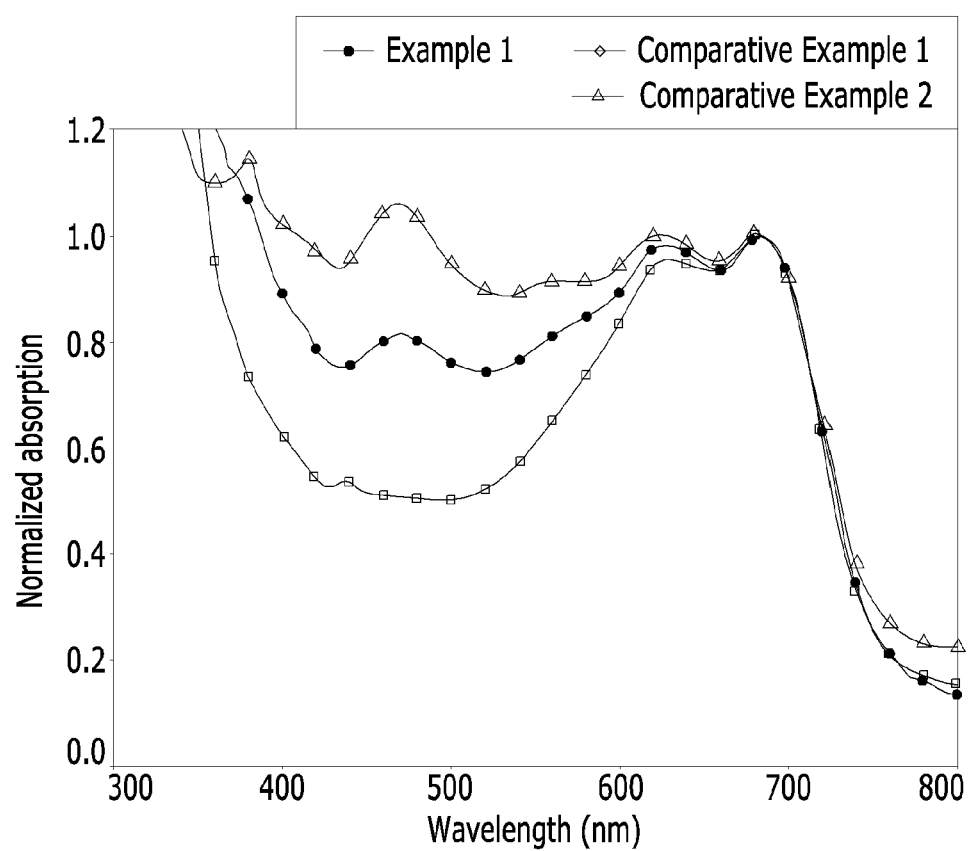
FIG. 3 is a graph showing light absorbance of solar cells according to Example 1 and Comparative Examples 1 and 2.

The results are provided in FIG. 3.

FIG. 3 is a graph showing light absorbance of the solar cells according to Example 1 and Comparative Examples 1 and 2.

Referring to FIG. 3, the solar cells according to Example 1 and Comparative Examples 1 and 2 have substantially equivalent light absorbance in a longer wavelength region, but a larger light absorbance difference in a shorter wavelength region.

Specifically, the solar cells according to Example 1 and Comparative Examples 1 and 2 have substantially equivalent light absorbance in a wavelength region ranging from about 600 to about 780 nm due to the electron donor commonly applied thereto.

On the other hand, the solar cell using PC60BM and PC70BM as electron acceptors according to Example 1 has about half the light absorbance in a wavelength region ranging from about 380 to about 600 nm compared with the solar cell using PC60BM as an electron acceptor according to Comparative Example 1 and the solar cell using only PC70BM as an electron acceptor according to Comparative Example 2.

Accordingly, a solar cell having desired light absorbance between that of the solar cell using only PC60BM as an electron acceptor according to Comparative Example 1 and that of the solar cell using only PC70BM as an electron acceptor according to Comparative Example 2 may be realized by adjusting a blending ratio of the $PC_{60}BM$ and the $PC_{70}BM$.

Evaluation 2: Current Density

Current densities of the solar cells according to Example 1 and Comparative Examples 1 and 2 are evaluated.

Herein, a xenon lamp (01193, Oriel) is used as a light source, and a solar condition (AM 1.5) of the xenon lamp is adjusted by using a standard solar cell (Frunhofer Institute Solare Engeriessysteme, Certificate No. C-ISE369, Type of material: Mono-Si+KG filter).

Figure 4:
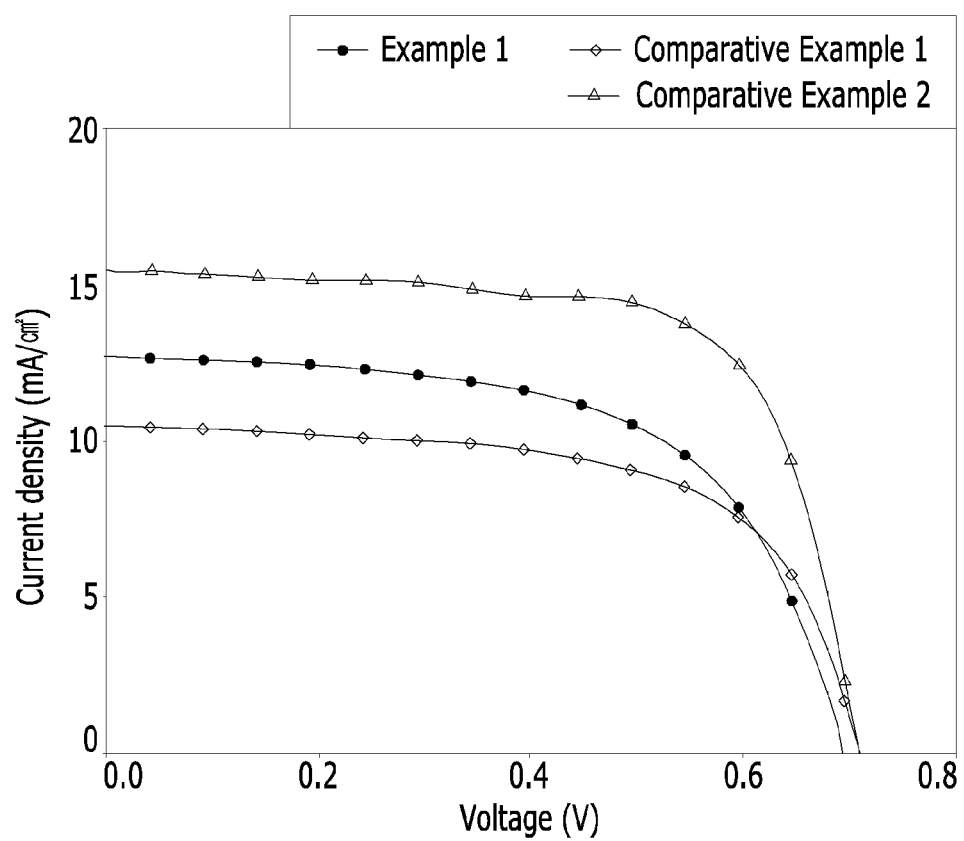
FIG. 4 is a graph showing current densities of solar cells according to Example 1 and Comparative Examples 1 and 2.

The results are provided in FIG. 4.

FIG. 4 is a graph showing current densities of the solar cells according to Example 1 and Comparative Examples 1 and 2.

Referring to FIG. 4, the solar cell according to Example 1 has current density around the middle of current densities of the solar cells according to Comparative Examples 1 and 2.

Accordingly, a blending ratio of the PC60BM and the PC70BM may be adjusted to realize a solar cell having a desired current density between the current densities of the solar cell using only PC60BM as an electron acceptor according to Comparative Example 1 and the solar cell using only PC70BM as an electron acceptor according to Comparative Example 2.

Manufacture of Organic Solar Cell-2

Example 2-1

A 180 nm-thick ITO anode is formed on a 1 mm-thick transparent glass substrate by a sputtering method.

A 30 nm-thick lower auxiliary layer is formed on the ITO anode by spin-coating PEDOT:PSS.

An 85 nm-thick active layer is formed on the lower auxiliary layer by applying a solution prepared by dissolving an electron donor (Mn=34,000) represented by the following Chemical Formula B and a PC60BM/PC70BM electron acceptor in a ratio of 1:2 (w/w) in chlorobenzene:1,8-diiodooctane (97:3, v/v).

Herein, the electron acceptor compounds, PC60BM and PC70BM, are mixed in a ratio of 99:1 (w/w).

Subsequently, a 5 nm-thick upper auxiliary layer is formed on the active layer by spin-coating TiOx ($0<x\leq2$).

A 100 nm-thick aluminum (Al) cathode is formed on the upper auxiliary layer, manufacturing an organic solar cell.

[Chemical Formula B]

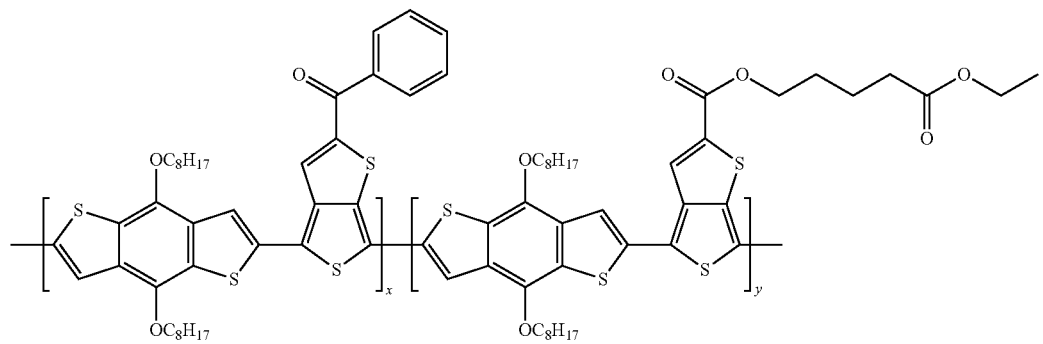

Example 2-2

An organic solar cell is manufactured according to the same method as Example 2-1, except for mixing $PC_{60}BM$ and $PC_{70}BM$ in a ratio of 9:1 (w/w) as an electron acceptor.

Example 2-3

An organic solar cell is manufactured according to the same method as Example 2-1, except for mixing $PC_{60}BM$ and $PC_{70}BM$ in a ratio of 8:2 (w/w) as an electron acceptor.

Example 2-4

An organic solar cell is manufactured according to the same method as Example 2-1, except for mixing $PC_{60}BM$ and $PC_{70}BM$ in a ratio of 7:3 (w/w) as an electron acceptor.

Example 2-5

An organic solar cell is manufactured according to the same method as Example 2-1, except for mixing $PC_{60}13M$ and $PC_{70}BM$ in a ratio of 6:4 (w/w) as an electron acceptor.

Evaluation 3

External quantum efficiency (EQE) and cumulative light absorbance of the organic solar cells according to Examples 2-1 to 2-5 are evaluated.

Figure 5:
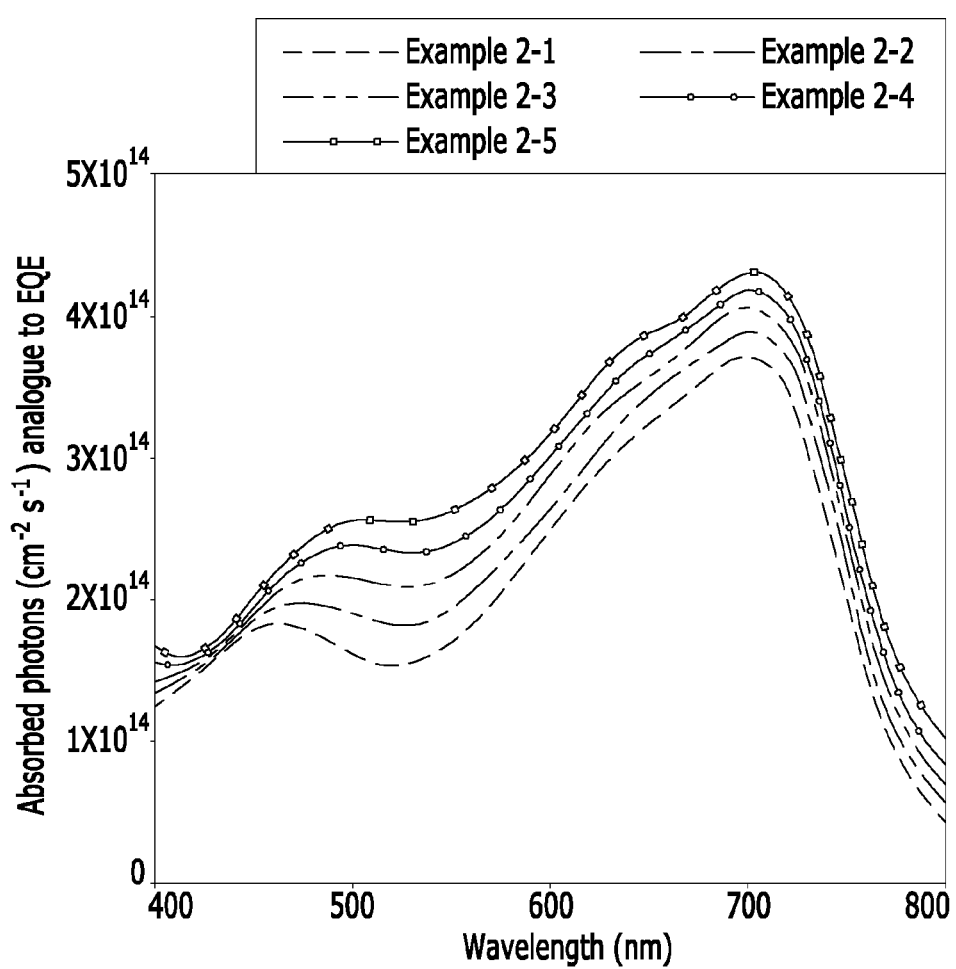
FIG. 5 is a graph showing external quantum efficiency (EQE) depending on a wavelength of the organic solar cell according to Examples 2-1 to 2-5.
Figure 6:
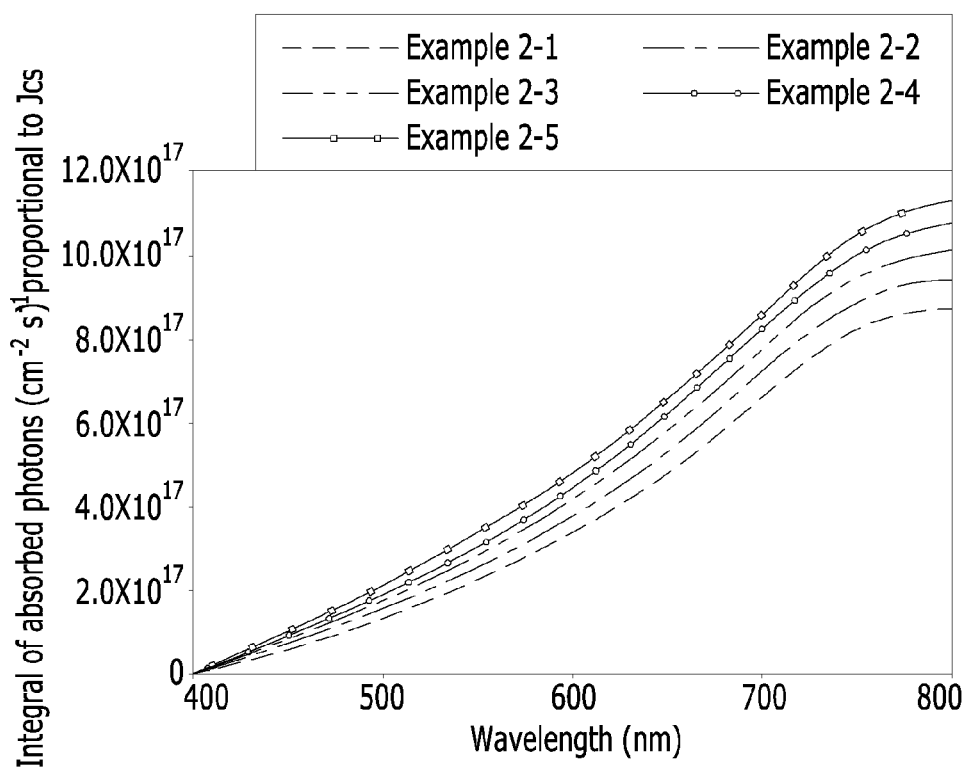
FIG. 6 is a graph showing cumulative light absorbance of the organic solar cells according to Examples 2-1 to 2-5.

The results are provided in FIGS. 5 and 6.

FIG. 5 is a graph showing external quantum efficiency (EQE) depending on a wavelength of the organic solar cells according to Examples 2-1 to 2-5, and FIG. 6 is a graph showing cumulative light absorbance of the organic solar cells according to Examples 2-1 to 2-5.

Referring to FIGS. 5 and 6, external quantum efficiency (EQE) and cumulative light absorbance of the organic solar cells according to Examples 2-1 to 2-5 may be subtly adjusted depending on a blending ratio of electron acceptors of an active layer, while absorption wavelength region thereof are maintained.

Manufacture of Tandem Organic Solar Cell

Reference Example

A 180 nm-thick ITO anode is formed on a 1 mm-thick transparent glass substrate by a sputtering method.

A 30 nm-thick lower auxiliary layer is formed on the ITO anode by spin-coating PEDOT:PSS.

A lower active layer is formed on the lower auxiliary layer by applying a solution prepared by dissolving an electron donor represented by the following Chemical Formula C and an electron acceptor represented by the following Chemical Formula D in dichlorobenzene.

Herein, the electron donor represented by the above Chemical Formula C and the electron acceptor represented by the above Chemical Formula D are mixed in a ratio of 1:1 (w/w).

A 5 nm-thick lower interconnection part is formed on the lower active layer by spin-coating titanium oxide (TiOx, ($0<x\leq2$)), manufacturing a lower sub-cell.

A 7 nm-thick upper interconnection part is formed on the lower interconnection part by vacuum-depositing tungsten oxide (WO3).

An upper active layer is formed on the upper interconnection part by applying a solution prepared by dissolving an electron donor (Mn=34,000) represented by the following Chemical Formula E and PC70BM as an electron acceptor in a ratio of 1:1.5 (w/w) in a mixture of chlorobenzene:1, 8-diiodooctane (97:3, v/v).

A 5 nm-thick upper auxiliary layer is formed on the upper active layer by spin-coating TiOx ($0<x\leq2$).

A 100 nm-thick aluminum (Al) cathode is formed on the upper auxiliary layer, manufacturing an upper sub-cell.

Subsequently, the lower sub-cell and the upper sub-cell are used to manufacture a tandem organic solar cell.

[Chemical Formula C]

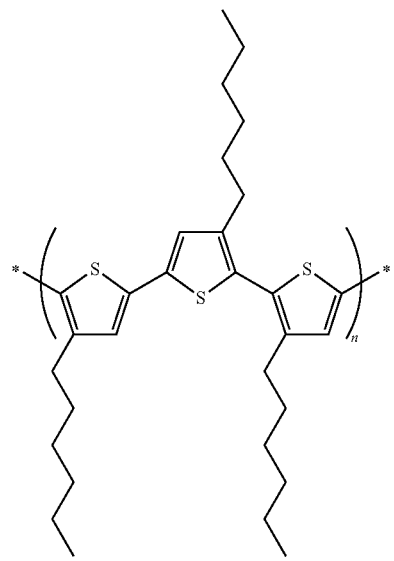

[Chemical Formula D]

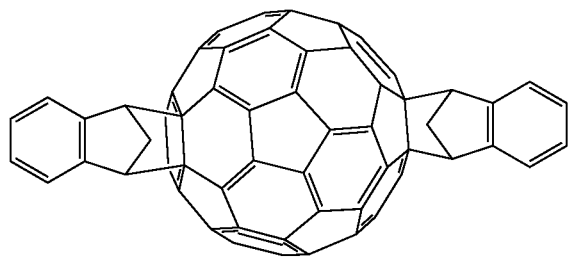

-continued

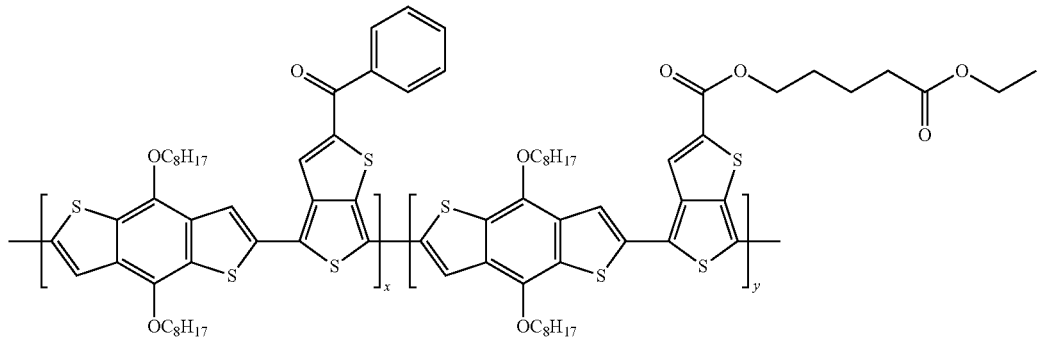

[Chemical Formula E]

Example 3

A tandem organic solar cell is manufactured according to the same method as the reference example except for using a mixture prepared by mixing $PC_{60}BM$ and $PC_{70}BM$ in ratios of 99:1, 9:1, 8:2, 7:3, 6:4, 5:5, 4:6, 3:7, 2:8, 1:9, and 1:99 (w/w) instead of using $PC_{70}BM$ as the electron acceptor for the upper sub-cell.

Evaluation 4

Light absorbance of the tandem organic solar cell according to Example 3 is evaluated.

Figure 7:
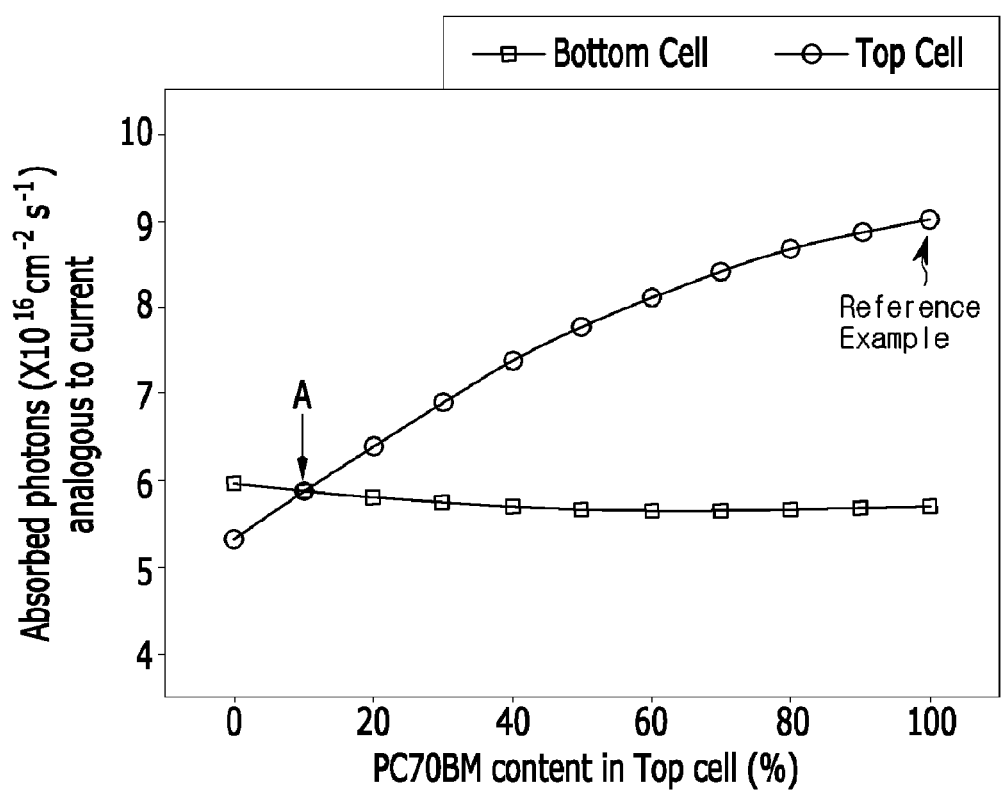
FIG. 7 is a graph showing light absorbance of a lower sub-cell and an upper sub-cell of the tandem organic solar cell according to Example 3.

FIG. 7 is a graph showing light absorbance of a lower sub-cell and an upper sub-cell of the tandem organic solar cell according to Example 3.

As shown in FIG. 7, the lower sub-cell shows relatively low light absorbance and has a relatively low output current, while the upper sub-cell shows relatively high light absorbance and thus a relatively high output current.

Referring to FIG. 7, the tandem organic solar cell according to Example 3 may decrease light absorbance and current amount differences of the upper sub-cell and the lower sub-cell depending on the blending ratio of the PC60BM/PC70BM of the upper sub-cell to find where the upper sub-cell and the lower sub-cell have substantially equivalent light absorbance and current amounts, starting from light absorbance and current amount of the tandem organic solar cell according to the reference example.

In FIG. 7, 'A' indicates where light absorbance and current amounts of the lower sub-cell and the upper sub-cell are matched.

Accordingly, a blending ratio of the electron acceptors in the upper sub-cell may be adjusted so that the upper sub-cell and the lower sub-cell may have substantially equivalent light absorbance and current amounts, and resultantly, substantially equivalent output currents.

Therefore, the adjustment of the blending ratio may suppress accumulation of excessive charges of the upper sub-cell having a relatively high output current inside an organic solar cell and an influence on performance of the organic cell.

Figure 8:
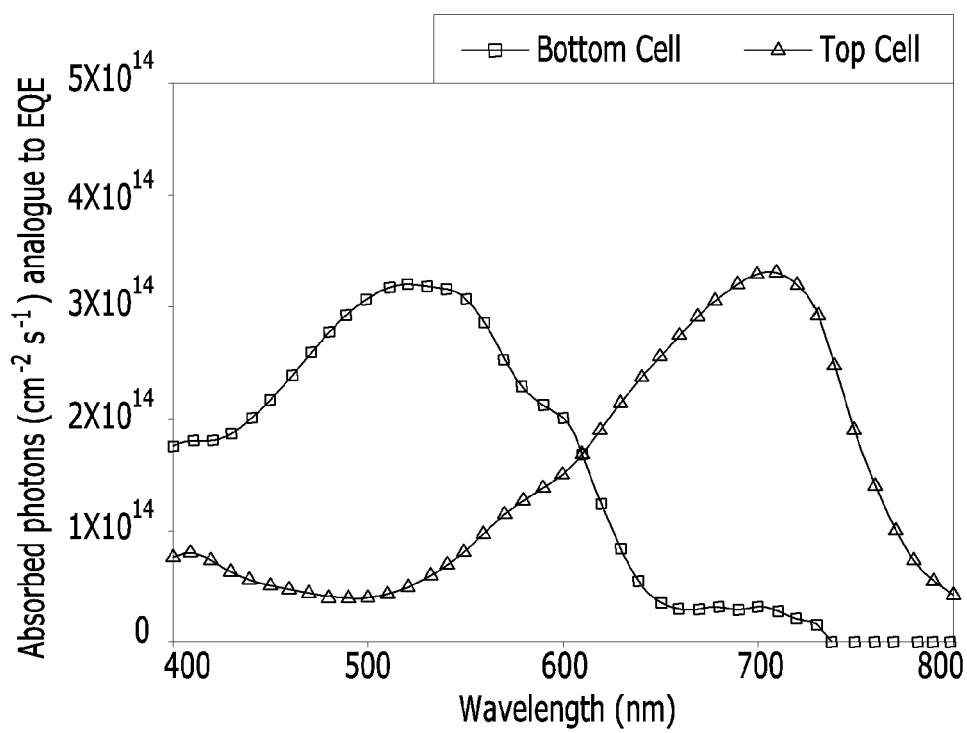
FIGS. 8 and 9 respectively show external quantum efficiency (EQE) and cumulative light absorbance depending on a wavelength of a tandem organic solar cell according to Example 3 at the point 'A' of FIG. 7.
Figure 9:
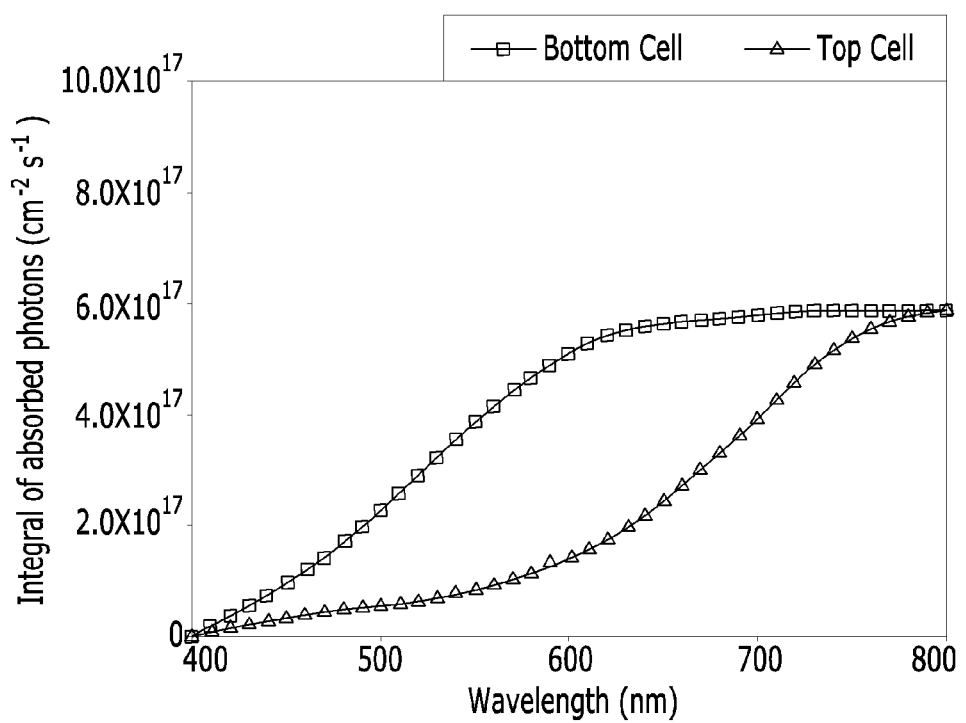

FIGS. 8 and 9 respectively show external quantum efficiency (EQE) and cumulative light absorbance depending on a wavelength of a tandem organic solar cell according to Example 3 at the point 'A' of FIG. 7.

Referring to FIGS. 8 and 9, the tandem organic solar cell according to Example 3 may have an improved light absorbing rate because the lower sub-cell and the upper sub-cell respectively absorb light in shorter and longer wavelength regions and also light in a relatively wide wavelength region, and may simultaneously substantially control cumulative light absorbance of the lower sub-cell and the upper sub-cell, and thus decrease excessive charges generated from a sub-cell having relatively high light absorbance and prevent or reduce performance degradation due to the excessive charges.

In addition, because the aforementioned effect is obtained by adjusting a blending ratio of electron acceptors of the sub-cell having a relatively high output current without artificially controlling thickness of a photoactive layer to balance output currents among a plurality of sub-cells, processibility of the tandem organic solar cell may be improved.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:
1. An organic solar cell, comprising:
 a first sub-cell including a first active layer, the first active layer including,
  a first electron donor absorbing light of a first wavelength region, and
  a first electron acceptor; and
 a second sub-cell including a second active layer having a different composition from the first active layer, the second active layer including,
  a second electron donor absorbing light of a second wavelength region longer than the first wavelength region, and
  a second electron acceptor having a first light absorbance and a third electron acceptor having a second light absorbance different from the first light absorbance,
 wherein the first active layer and the second active layer are configured to absorb light of different wavelength regions from each other.
2. The organic solar cell of claim 1, wherein
 the second electron acceptor and the third electron acceptor absorb light having equivalent wavelength regions to each other, and
 the second electron acceptor and the third electron acceptor absorb light of different wavelength regions from the second electron donor.

3. The organic solar cell of claim 1, wherein the second electron acceptor and the third electron acceptor are included in a weight ratio of about 1:99 to about 99:1.

4. The organic solar cell of claim 1, wherein
the second electron acceptor includes a compound having a light absorbing moiety of an optically symmetric structure, and
the third electron acceptor includes a compound having a light absorbing moiety of an optically asymmetric structure.

5. The organic solar cell of claim 4, wherein
the second electron acceptor includes a fullerene derivative having a fullerene core of an optically symmetric structure, and
the third electron acceptor includes a fullerene derivative having a fullerene core of an optically asymmetric structure.

6. The organic solar cell of claim 5, wherein the fullerene derivative of the second electron acceptor and the third electron acceptor have a common functional group.

7. The organic solar cell of claim 5, wherein
the second electron acceptor includes one of $C_{60}$, $PC_{60}BM$, $IC_{60}BA$, and a combination thereof, and
the third electron acceptor includes one of $C_{70}$, $PC_{70}BM$, $IC_{70}BA$, and a combination thereof.

8. The organic solar cell of claim 1, wherein
the first electron donor includes a first compound having a bandgap of about 1.6 to about 2.2 eV, and
the second electron donor includes a second compound having a bandgap of about 0.6 to about 2.0 eV.

9. The organic solar cell of claim 1, wherein
the first wavelength region is about 200 nm to about 780 nm, and
the second wavelength region is about 400 nm to about 2000 nm.

10. An organic solar cell, comprising:
a first electrode;
a first active layer on one side of the first electrode, the first active layer including a first electron donor absorbing light of a first wavelength region and a first electron acceptor;
an interconnection part on one side of the first active layer;
a second active layer on one side of the interconnection part, the second active layer having a different composition from the first active layer and including a second electron donor absorbing light of a second wavelength region longer than the first wavelength region, and a second electron acceptor having a first light absorbance and a third electron acceptor having a second light absorbance different from the first light absorbance, and
a second electrode on the second active layer,
wherein the first active layer and the second active layer are configured to absorb light of different wavelength regions from each other,
wherein the first electrode, the first active layer, and the interconnection part generate a first output current, and
wherein the second electrode, the second active layer, and the interconnection part generate a second output current, the second output current being about 0.9 to about 1.1 times the first output current, by controlling a composition ratio of the second electron acceptor and the third electron acceptor.

11. The organic solar cell of claim 10, wherein
the first wavelength region is about 200 nm to about 780 nm, and
the second wavelength region is about 400 nm to about 2000 nm.

12. The organic solar cell of claim 10, wherein the second electron acceptor and the third electron acceptor are included in a weight ratio of about 1:99 to about 99:1.

13. The organic solar cell of claim 10, wherein
the second electron acceptor and the third electron acceptor absorb light having equivalent wavelength regions to each other, and
the second electron acceptor and the third electron acceptor absorb light of different wavelength regions from the second electron donor.

14. The organic solar cell of claim 10, wherein
the second electron acceptor includes a fullerene derivative having a fullerene core of an optically symmetric structure, and
the third electron acceptor includes a fullerene derivative having a fullerene core of an optically asymmetric structure.

15. The organic solar cell of claim 14, wherein the fullerene derivative of the second electron acceptor and the third electron acceptor have a common functional group.

16. The organic solar cell of claim 10, wherein the interconnection part comprises at least one multilayer including at least one of a conductive polymer, an insulating polymer, a ferroelectric polymer, and a metal oxide.

17. The organic solar cell of claim 16, wherein the at least one multilayer is a plurality of multilayers, and the interconnection part further comprises:
a conductive thin film between the plurality of multilayers.

* * * * *